United States Patent
Brunner et al.

(10) Patent No.: US 7,375,505 B2
(45) Date of Patent: May 20, 2008

(54) METHOD AND APPARATUS FOR TESTING FUNCTION OF ACTIVE MICROSTRUCTURAL ELEMENTS AND METHOD FOR PRODUCING MICROSTRUCTURAL ELEMENTS USING THE TEST METHOD

(75) Inventors: Matthias Brunner, Kirchheim (DE); Ralf Schmid, Poing (DE)

(73) Assignee: Applied Materials, Inc., Santa Clara, CA (US)

( * ) Notice: Subject to any disclaimer, the term of this patent is extended or adjusted under 35 U.S.C. 154(b) by 597 days.

(21) Appl. No.: 10/115,685

(22) Filed: Apr. 4, 2002

(65) Prior Publication Data
US 2005/0212545 A1 Sep. 29, 2005

Related U.S. Application Data

(63) Continuation-in-part of application No. 09/482,756, filed on Jan. 13, 2000, now abandoned.

(30) Foreign Application Priority Data
Jan. 18, 1999 (DE) .................. 199 01 767

(51) Int. Cl.
*G01R 31/02* (2006.01)

(52) U.S. Cl. .................. 324/76.11; 324/751; 324/752; 324/765

(58) Field of Classification Search ........... 324/751, 324/752, 764, 765, 76.11
See application file for complete search history.

(56) References Cited

U.S. PATENT DOCUMENTS 5,834,773 A * 11/1998 Brunner et al. ............. 250/310
6,304,095 B1 * 10/2001 Miyamoto .................. 324/765

* cited by examiner

*Primary Examiner*—Vincent Q. Nguyen
(74) *Attorney, Agent, or Firm*—Muramatsu & Associates

(57) ABSTRACT

A method and an apparatus for testing the function of a plurality of microstructural elements by irradiation with particle radiation. All of the microstructural elements detected as malfunctioning are listed in a first error list in a first test sequence. The microstructural elements listed in the first error list are tested once more in at least one further test sequence and at least the result of the test sequence last carried out is evaluated to establish the overall test result. The first test sequence is designed so that, if possible, all of the microstructural elements which are actually malfunctioning are detected. The invention further relates to a method for producing microstructural elements which are constructed as a plurality on a substrate and are tested according to the above test method.

19 Claims, 3 Drawing Sheets

METHOD AND APPARATUS FOR TESTING FUNCTION OF ACTIVE MICROSTRUCTURAL ELEMENTS AND METHOD FOR PRODUCING MICROSTRUCTURAL ELEMENTS USING THE TEST METHOD

This is a continuation-in-part of U.S. patent application Ser. No. 09/482,756 filed Jan. 13, 2000 now abandoned.

FIELD OF THE INVENTION

The invention relates to a method and an apparatus for testing the function of a plurality of active microstructural elements.

BACKGROUND OF THE INVENTION

The term active microstructural elements is intended to refer, for example, to elements of the microelectronics sector (such as transistors, diodes, metal-insulator-metal elements), image elements and displays, electrode structures of micromechanical sensors and actuators as well as elements which emit particle radiation (for example, light or electrodes), such as laser diodes or field emission tips.

Microstructural elements of that type are produced as a plurality on a substrate, for example, wafers or glass plates. In the microstructural technology sector, mechanical, optical, electrical and other elements are produced using methods and processes which have been known for some time in the microelectronics sector. Accordingly, the known errors also occur during production, caused, for example, by contaminants or misalignments. In order to be able to ensure a fault-free function for the microstructural elements, therefore, it is necessary to test the function of every individual element. However, testing microstructural elements places special requirements on the method used and the corresponding apparatus owing to the small dimensions.

Microstructural elements of the microelectronics sector are usually tested on the wafer in that probe tips contact the individual elements (chips) and subject them to a sequence of electrical tests. Contact-free methods using particle radiation are known, for example, from U.S. Pat. No. 3,531,716 owing to the rapid measurement of the electrical functions of transistors, lines as well as capacitors and resistors. Those known methods are substantially based on the fact that the electrical charge at a specific point of the component is measured by means of released secondary electrons using an electron beam.

Another method utilizing the contact-free technology is known, for example, from EP-B-0 523 594, in which the function of elements in liquid crystal displays is tested. That method uses particle radiation, preferably an electron beam, both for the charge measurement and for the supply of current to the display elements.

However, all known contract-free methods detect malfunction-free elements as malfunctioning if the error thresholds for the evaluation are set too close to the desired values of the measurement signals. On the other hand, if a sufficient difference between the desired values and threshold values is set, malfunctions might not be detected. Furthermore, only result data within a very restricted range are available for malfunction classifications as a result of the conventional tests.

SUMMARY OF THE INVENTION

Therefore, the problem addressed by the invention is to provide a method and an apparatus for testing the function of microstructural elements using particle radiation and a method for the production of microstructural elements, allowing a more precise malfunction definition.

According to the invention, the method is based on the fact that all of the active microstructural elements detected as malfunctioning are listed in a first error list in a first test sequence, the microstructural elements listed in the first error list are re-tested in at least one further test sequence and at least the result of the test sequence last carried out is evaluated to establish the overall test result. The test parameters are set in the first test sequence so that all of the malfunctioning microstructural elements are detected. Only the microstructural elements included in the error list are verified once more in the further test sequences.

Of course, the results of several or all of the test sequences can also be evaluated to establish the overall result.

In a preferred embodiment, there is carried out, in at least one further test sequence, not only an error confirmation but also a characterization of the error type of the microstructural element. The error type of the microstructural element is advantageously established by changing the test parameters in the further test sequences.

Since the number of microstructural elements on a substrate is usually in the region of several million and the number of malfunctioning elements should be substantially less than one thousand, a test time shorter by at least a factor of one thousand results for the method according to the invention for the further test sequences. Therefore, it is readily possible to improve the test reliability and the error characterization by further test sequences without substantially increasing the test time.

Further developments and advantages of the invention are explained in greater detail with reference to the description below and the drawings.

DETAILED DESCRIPTION OF THE INVENTION

Figure 1:
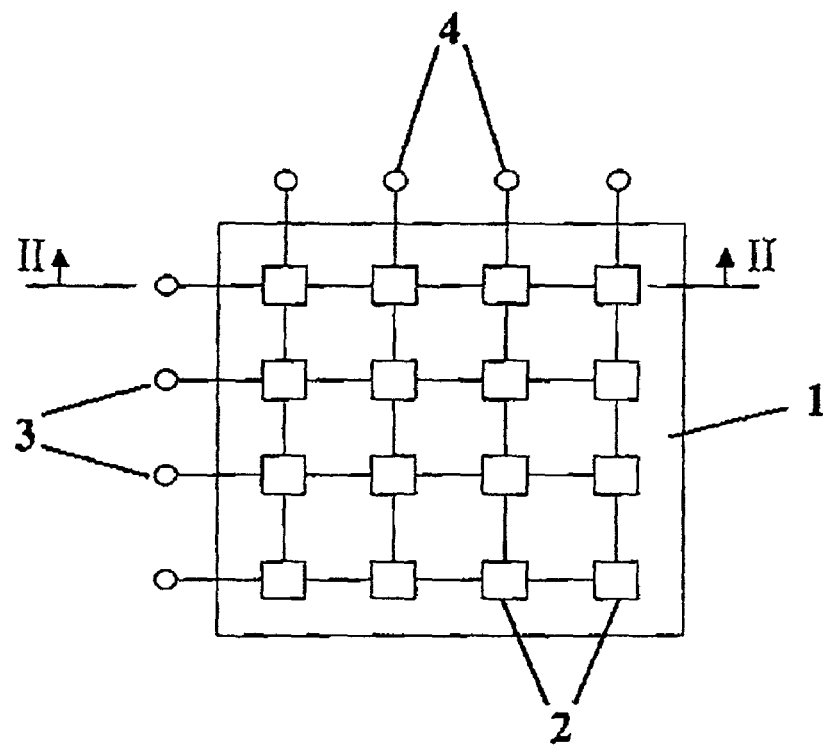
FIG. 1 is a schematic top view of a substrate having a plurality of microstructural elements to be tested.
Figure 2:
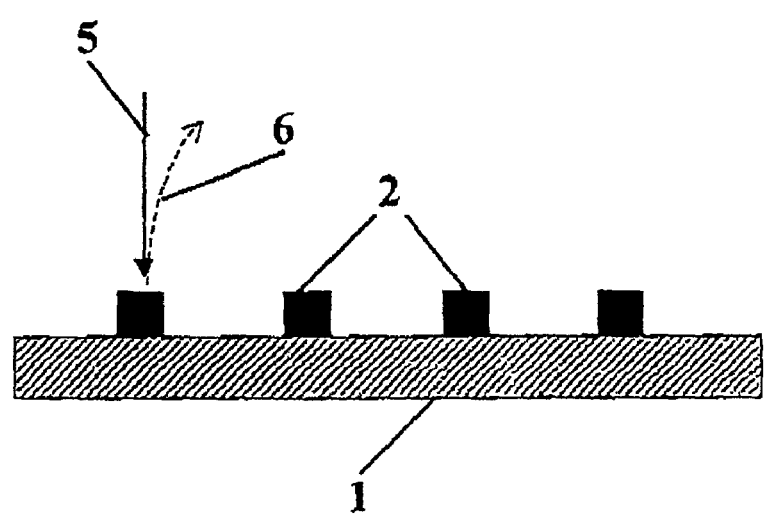
FIG. 2 is a schematic cross sectional view along the line II-II of FIG. 1.
Figure 3:
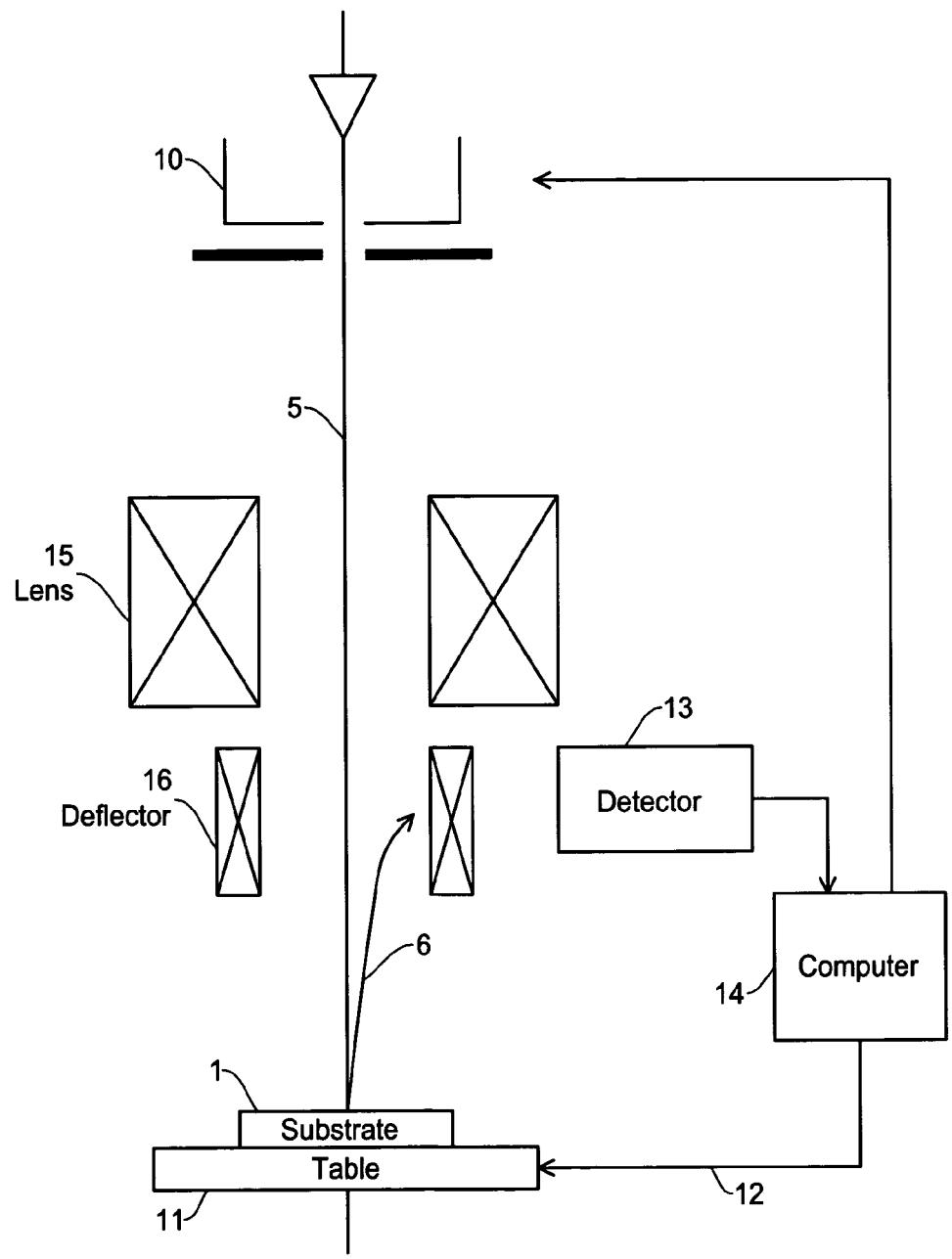
FIG. 3 is a schematic block diagram of an apparatus for testing the function of a plurality of microstructural elements on the substrate under test.
Figure 4:
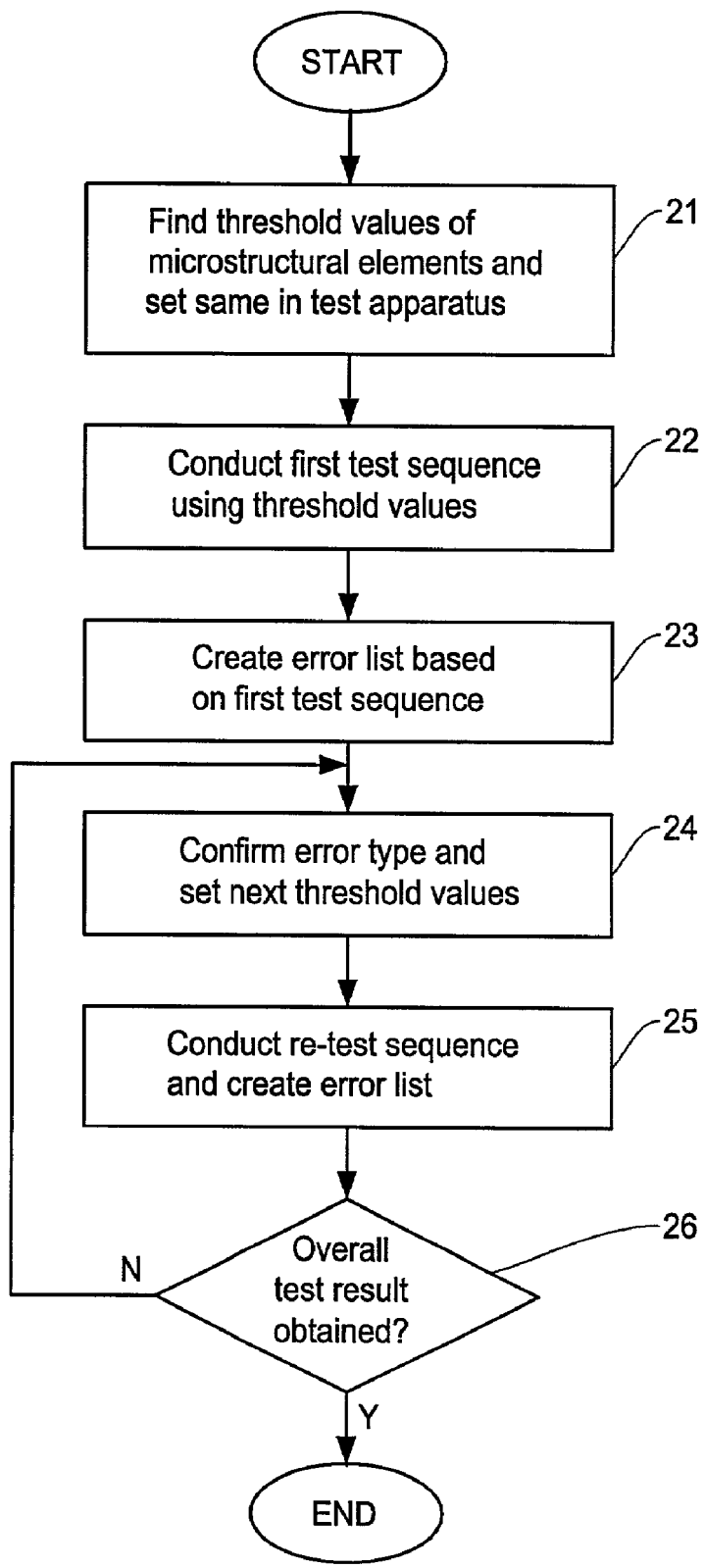
FIG. 4 is a flow chart showing an example of operational process for testing the microstructural elements by the test method of the present invention.

In FIGS. 1-3, a substrate 1, for example, a semiconductor wafer or liquid crystal display panel, is depicted and has a plurality of microstructural elements, the microstructural elements 2 being controllable by means of lines 3 and 4. FIG. 4 shows an operational flow of the test method of the present invention.

Possible microstructural elements include, for example, elements of the microelectronics sector (such as transistors, diodes, metal-insulator-metal elements), image elements and displays, electron structures of micromechanical sensors and actuators as well as elements (such as laser diodes or field emission tips) which emit particle radiation (for example, light or electrons). The electrical and/or mechanical properties, for example, can be tested for such microstructural elements. In addition, tests in respect of the emission properties are of interest for some microstructural elements, such as, for example, laser diodes or field emission tips.

The term electrical properties is intended to refer to all of the properties of electronic elements which determine the function thereof. Those are, in particular, voltage levels, increase in switching edges and the timing relationship among various signals in integrated circuits and the charge storage, charging, charging dissipation and switching voltage for thin-layer transistors and elements in liquid crystal arrays.

The verification of mechanical properties is affected, for example, on arrays of micromechanical reflectors, as used, for example, for projection displays.

The term emission properties is intended to refer to all of the properties of the radiation or corpuscles which are emitted during the normal operation of the microstructural element. Those are, for example, luminous flux, luminance, beam divergence, etc., of light-emitting diodes and laser diodes. In the case of electron emitters which are produced as a plurality on a substrate, the electron emission current, the flow density and the electron energy distribution, for example, are of interest.

To realize the aspects according to the present invention, it is preferred to decide whether or not a microstructural element is malfunctioning or not in a first test sequence according to the following. First, find a value for the signal measured that corresponds to an average functioning microstructural element. Afterwards, set thresholds values above and below this normal value to determine the range of measured signals value, that will be acceptable (step 21 in FIG. 4). In case a measurement will be out of the range set by these threshold values, a microstructural element will be detected as malfunctioning.

Even though it is desirable to find, if possible, all malfunctioning microstructural elements, this will in practice be very difficult. Thus, for example thresholds to decide whether or not a microstructural element is malfunctioning, are preferably set in a way that at least 70% of all malfunctioning microstructural elements are designated as malfunctioning, more preferred at least 80% of all malfunctioning microstructural elements are detected as malfunctioning, even more preferred 90% of all malfunctioning microstructural elements are detected as malfunctioning.

By changing for example a threshold, the probability that also functioning elements are detected as malfunctioning changes as well. If, for example, threshold values are set to 80% and 120% of a normal signal value, about 1 out of 100,000 microstructural elements under test are incorrectly designated as malfunctioning. If these thresholds are set to 95% and 105% of a normal signal value, about 10 out of 100,000 microstructural elements under test are incorrectly designated as malfunctioning. This incorrect detection of functioning microstructural elements as malfunctioning microstructural elements can, however, be corrected in the second test sequence.

Thereby, the signal values used can be one of a variety of test results. In general, if a microstructural element is tested, a measurement result is expected. This result can be determined, for example, by conducting one or several measurements on functioning microstructural elements serving as a reference. From such a reference measurement, a signal value typically expected and a respective deviation from the mean value can be obtained. This typically expected signal value obtained from a reference is referred to as a normal value. The normal value could then be used as a measure for a functioning microstructural element. Deviations beyond a certain percentage from this normal value would be used as an indication of a malfunctioning element.

By performing the first test sequence (step 22 of FIG. 4), a first error list is created which lists all of the microstructural elements detected as malfunctioning (step 23 of FIG. 4). Preferably, the error types or other error information are evaluated to determine the threshold values for a second test sequence, i.e., a re-test process (step 24 of FIG. 4).

For a re-test of the elements listed as malfunctioning in a first test sequence, the threshold values can preferably be changed. However, it would also be possible to stick to the parameters from the first test sequence and re-test several times. Thereby, the accuracy of the measurement can be statistically improved. This gives less necessity to change the test parameters. The fact that it would be possible to retest microstructural elements detected as malfunctioning in a first test sequence several times is given, since the number of elements to be re-tested from the retest list is at least some order of magnitudes. e.g. 1,000, below the total number of elements under test.

It can, however, also be considered advantageous to change the test parameter for a re-test. This procedure of changing test parameters can either be used for a verification of the first test result or for a characterization of the malfunctioning detected in the first test sequence. The change of test parameters can be performed according to one of the following examples.

If, in a first test sequence, a voltage is applied to an active microstructural element such that this element is conductive, for a further test sequence, a voltage could be applied such that the active microstructural element blocks or is at its point of highest transconductance. The parameters for the first test sequence and a further test sequence can also be exchanged.

Further, it is possible to have different voltages applied to adjacent microstructural elements and exchange these voltages between the adjacent elements for a further test sequence.

Further, it is possible to vary the irradiation duration of the corpuscular beam. For example a microstructural element could, during a first test sequence, be irradiated with charged particles less than 3 µs to avoid charging. The irradiation for a further test sequence could last at least 5 µs to change the test conditions and have charging of the element for this further test sequence.

Another possibility to vary parameters of a further test sequence compared to a first test sequence is to vary a retarding field. A retarding field is used for an energy selection of the electrons emitted by the microstructural element. A typical retarding field used for the emitted electrons has a voltage of about −5V. This voltage could be used for a first test sequence. For a further test sequence this retarding field can be varied by a few volts to a higher or lower retarding field.

After the second test sequence (step 25 of FIG. 4), it is determined whether the overall test results have been established (step 26 of FIG. 4). Thus, the above procedure will be repeated until the overall test results are obtained, and the process ends.

Specific example of the present invention for testing the microstructural elements is described below with reference to FIGS. 1-4. For testing the function of a plurality of microstructural elements 2 on the substrate 1, the microstructural elements 2 are irradiated with particle radiation 5. In principle, there are two possibilities for testing the function.

(1) The irradiated microstructural element 2 is externally controlled accordingly in a simultaneous manner by means of the lines 3 and 4 so that the properties or the function of the microstructural element 2 can be established by way of the secondary corpuscles (electrons) 6 released or reflected by the particle radiation at the microstructural element 2.

(2) The charge applied to a microstructural element by the particle radiation 5 is verified by means of the lines 3 and 4.

It is possible to verify the function of the microstructural element by comparison with desired values using the secondary electrons 6 or the current which flow via the lines 3 and 4. The method for testing the function of a plurality of microstructural elements by irradiation with particle radiation provides that, firstly, all of the microstructural elements which are detected as malfunctioning in a first test sequence are listed in a first error list, the first test sequence being designed so that all of the microstructural elements that are actually malfunctioning are detected. This can be done, for example, by setting the error threshold values close enough to the reference values. All of the microstructural elements listed in that first error list are then tested once more in at least one further test sequence. At least the result of the test sequence last carried out is evaluated to establish the overall result.

Since the number of microstructural elements on a substrate is usually in the region of several million and the number of malfunctioning elements should be substantially less than one thousand, that method results in a test time shorter by at least a factor of one thousand for the further test sequences in comparison with the repeated test of all of the elements. Therefore, it is readily possible to carry out several test sequences for the further improvement of the test reliability and the error characterization without substantially increasing the test time.

Since the first test sequence is designed so that in all cases all of the malfunctioning microstructural elements are detected, that means, of course, that a few microstructural elements are also incorrectly designated as malfunctioning. That incorrect designation can, however, be corrected in the further test sequence(s).

When the electrical properties or microstructural elements are tested, it is, for example, possible to verify internal signals in a microstructural element on the substrate which are produced during operation by way of external connections (lines 3 and 4) or by simulation with the particle radiation so that malfunctioning circuits can be separated. The repeated measurements of a value which deviates from the desired value in the first measurement must confirm the results of the first measurement in order to provide a reliable error report. The characterization of the error can be improved in that other test parameters are used for the second test sequence and for any further test sequences. It is possible, for example, to control the microstructural element electrically in different manners in the individual test sequences and/or to use other parameters for the particle radiation in the individual test sequences.

For example, it is possible to use different supply voltages, frequencies and integration time intervals for the second and further test sequences and, if applicable, also to measure different values at the malfunctioning microstructural element.

Using the method of this invention, it is possible, for example, to test reliably the function of image elements of an active TFT matrix of a liquid crystal screen, the malfunctions being characterized for possible repair. The image elements detected as malfunctioning in the first test sequence are verified once more, which results in the suppression of statistically occurring error reports in the simplest case with simple repetition of the first test sequence. Furthermore, it is possible to work with different voltages at the supply lines 3, 4 of the matrix, different particle radiation pulse duration, particle radiation voltages, detection parameters, etc., in the further test sequences.

When mechanical properties are verified, for example, for micromechanical reflector arrays, the individual reflector elements are controlled by means of lines 3, 4 and mechanically deflected to a specific extent. An inadequate deflection of individual elements would result in errors in the image generation. In order to be able to verify that, every individual element must be verified in order to ensure fault-free function. The verification is carried out advantageously by the particle radiation, it being necessary to reflect the corpuscles at a specific angle as a function of the desired position of the reflector to be verified. If the reflected corpuscles are not detected by the detector, that indicates an inadequate function or deflection of the reflector.

To that end, a light beam is preferably used as the particle radiation. A reflector element, detected as malfunctioning in the first test sequence, is then verified in at least one further test sequence. That verification can also be affected, for example, with a different control action or deflection action of the reflector. Similarly, more precise measurements, for example, with a longer integration time, are conceivable in order to distinguish different error mechanisms from one another.

The emission properties are of particular interest in arrays of field emission tips as used, for example, for flat screens. In order to be able to better characterize the errors, it is possible to carry out the further test sequences, for example, using different voltages at emitters. Malfunctioning emitters can then be repaired, if necessary, or the array as a whole is removed in order to avoid the further function steps which are then unnecessary.

The apparatus depicted in FIG. 3 for testing the function of a plurality of microstructural elements according to the above-described method substantially comprises a source 10 for the generation of the particle radiation 5, means (table) 11 for receiving the elements to be tested or the substrate 1, if necessary means 12 for controlling the microstructural elements on the substrate, a detector 13 for detecting the secondary corpuscles 6 which are emitted or reflected by the particle radiation 5 at the microstructural element. Furthermore, means (computer) 14 for evaluating the output signals of the detector 13 are provided, a first data store for storing the data of a first and at least one further test sequence being provided. Finally, means are present for evaluating the results of the test sequence in order to establish the overall test result. The means for evaluating the output signals of the detector, the data store and the means for establishing the overall test result are advantageously produced as a computer 14.

The source 10 is, for example, designed to generate an electron beam, a laser beam or an ion beam. Under some circumstances, it is also advantageous to provide several different sources in the apparatus in order to irradiate the microstructural elements with different particle radiation in the further test sequence.

The apparatus further contains all other necessary and generally known means, of which only a lens 15 and a deflection device 16 are depicted.

The above-described test method is particularly suitable for a method for the production of microstructural elements which are constructed and tested as a plurality on a substrate. The microstructural elements can, for example, be display elements such as pixels on a display panel.

The test method can optionally be carried out on an intermediate product or on the completely constructed microstructural elements.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for testing functions of a plurality of active microstructural elements by irradiation with particle radiation, comprising the following steps of:
    listing all of the microstructural elements detected as malfunctioning in a first error list in a first test sequence, comprising the following steps of:
        setting a threshold value to judge whether or not a microstructural element is malfunctioning, whereby the threshold value is set so that also functioning microstructural elements are incorrectly designated as malfunctioning;
        adding all microstructural elements that exceed the threshold value to the first error list;
    re-testing the microstructural elements listed in the first error list in at least one further test sequence; and
    evaluating at least the result of the test sequence last carried out to establish the overall test result.

2. A method according to claim 1, wherein the re-testing step includes a step of carrying out an error confirmation and a characterization of the error type of the microstructural element.

3. A method according to claim 1, wherein, for each microstructural element, corpuscles which are released from the microstructural element by the particle radiation are detected and evaluated.

4. A method according to claim 3, wherein the microstructural elements which are detected as malfunctioning during a specific test sequence when the corpuscles detected are evaluated are included in the error list which belongs to the test sequence.

5. A method according to claim 1, wherein the microstructural elements are electrically controlled during the test sequences.

6. A method according to claim 1, wherein test parameters are changed for the further test sequence in order to characterize the error type of the microstructural element.

7. A method according to claim 6, wherein the test parameters for the particle radiation are changed for every further test sequence.

8. A method according to claim 7, wherein energy of the particles radiation is changed.

9. A method according to claim 7, wherein emission time of the particles radiation is changed.

10. A method according to claim 1, wherein the results of all of the test sequences are evaluated to establish the overall test result.

11. A method for producing microstructural elements which are constructed and tested as a plurality on a substrate, wherein the test method is effected according to claim 1.

12. A method according to claim 11, wherein the test method is affected on a completely constructed microstructural element.

13. A method according to claim 11, wherein the test method is affected on an intermediate product of the microstructural element.

14. A method for testing functions of a plurality of active microstructural elements by irradiation with particle radiation, comprising the following steps of:
    listing all of the microstructural elements detected as malfunctioning in a first error list in a first test sequence, the first test sequence being designed so that all of the microstructural elements that are actually malfunctioning are detected;
    re-testing the microstructural elements listed in the first error list in at least one further test sequence; and
    evaluating at least the result of the test sequence last carried out to establish the overall test result.

15. A method according to claim 14, wherein the microstructural elements are electrically controlled during the test sequences.

16. A method according to claim 14, wherein test parameters are changed for the further test sequence in order to characterize the error type of the microstructural element.

17. A method for testing the function of a plurality of active microstructural elements by irradiation with particle radiation, comprising the following steps of:
    listing all of the microstructural elements detected as malfunctioning in a first error list in a first test sequence, the first test sequence being designed so that at least 80% of the microstructural elements that are actually malfunctioning are detected;
    re-testing the microstructural elements listed in the first error list in at least one further test sequence; and
    evaluating at least the result of the test sequence last carried out to establish the overall test result.

18. A method according to claim 17, wherein the microstructural elements are electrically controlled during the test sequences.

19. A method according to claim 17, wherein test parameters are changed for the further test sequence in order to characterize the error type of the microstructural element.

* * * * *